United States Patent [19]

Dahlberg

[11] 4,370,509

[45] Jan. 25, 1983

[54] SOLAR CELL ARRAY

[75] Inventor: Reinhard Dahlberg, Flein, Fed. Rep. of Germany

[73] Assignee: Licentia Patent-Verwaltungs-GmbH., Frankfurt am Main, Fed. Rep. of Germany

[21] Appl. No.: 298,926

[22] Filed: Sep. 2, 1981

[30] Foreign Application Priority Data

Sep. 26, 1980 [DE] Fed. Rep. of Germany ....... 3036261
Jun. 23, 1981 [DE] Fed. Rep. of Germany ....... 3124581

[51] Int. Cl.³ .......................................... H01L 31/04
[52] U.S. Cl. ................................................. 136/244
[58] Field of Search ................. 136/244, 245; 357/65, 357/67

[56] References Cited

U.S. PATENT DOCUMENTS

| 3,454,774 | 7/1969 | Wizenick | 136/244 |
| 3,953,876 | 4/1976 | Sirtl et al. | 357/60 |
| 4,193,820 | 3/1980 | Thomas | 136/244 |
| 4,296,270 | 10/1981 | Köhler | 136/244 |
| 4,306,108 | 12/1981 | Henesian | 136/245 |

FOREIGN PATENT DOCUMENTS

| 2350696 | 12/1977 | France . | |
| 55-95377 | 7/1980 | Japan | 136/244 |
| 1333593 | 10/1973 | United Kingdom | 136/244 |

OTHER PUBLICATIONS

W. Luft, "Solar Cell Interconnector Design", *IEEE Trans. Aerospace & Electronic Systems*, vol. AES-7, pp. 781-791 (1971).

H. S. Rauschenbach, "Solar Cell Array Design Handbook", Van Nostrand Reinhold Co. (1980), pp. 268-297.

Von Hans Rainer Hilzinger, "Amorphe Metalle, eine neue Werkstoffgruppe", from Swiss publication Technische Rundschau, Nr. 6, Feb. 12, 1980, p. 5.

*Primary Examiner*—Aaron Weisstuch
*Attorney, Agent, or Firm*—Spencer & Kaye

[57] ABSTRACT

A solar cell array comprising a plurality of solar cells connected together by electrical contact means comprising amorphous metal alloy conductors.

4 Claims, 3 Drawing Figures

SOLAR CELL ARRAY

BACKGROUND OF THE INVENTION

This invention relates to a solar cell array.

An important factor in connecting together solar cells to form larger arrays, i.e. so-called "panels", is the longevity of these panels. The critical point with regard to longevity rests with the electrical connections between the individual solar cells. During operation the solar cells are heated above the surrounding temperature and at night or when the radiation is reduced they cool down again. As a result, differences in thermal expansion occur and affect the contact connections by applying mechanical loads. During long term operation, the contacts may start to suffer from fatique and this may result in faults.

SUMMARY OF THE INVENTION

It is an object of the invention to provide a solar cell array which does not have these disadvantages and which has a reliable long life contact between the solar cells.

According to a first aspect of the invention, there is provided a solar cell array comprising a plurality of solar cells and electrical means connector comprising amorphous metal conductors between said solar cells.

According to a second aspect of the invention, there is provided a solar cell array comprising solar cells which are connected together electrically, in which the electrical connectors between the solar cells are strips or wires comprising amorphous metals.

BRIEF DESCRIPTION OF THE DRAWINGS

The invention will now be described in greater detail, by way of example, with reference to the drawings, in which.

DESCRIPTION OF THE PREFERRED EMBODIMENT

Basically, the invention proposes a solar cell array which comprises electrically connected solar cells using strips or wires of amorphous metal for electrical connection between the solar cells. Because they do not have a crystal lattice, amorphous metals do not exhibit any mechanical fatigue. In addition they have very good corrosion characteristics. These two properties make them particularly suitable for stable, long-term electrical connection between solar cells.

Amorphous metals containing iron, aluminium, zinc, lead, tin, copper, nickel, cobalt, chromium, molybdenum or vanadium as alloy components are particularly suitable in term of their cost. Non-metallic matrials such as boron, silicon, carbon, phosphorous, arsenic, etc., are preferably added to these alloy components. Amorphous metal strips or wires are applied to the front or rear face contact of the solar cell preferably with the aid of ultrasonic bonding. The front and rear face contacts may be formed rigidly on the solar cell however, by soldering or welding on a metal element and the amorphous metal strips or wires can then be applied to these metal elements so as to provide for good electrical conduction with the aid of a mechanical pressure contact, an adhesion contact, a solder contact or a welded contact.

Specific embodiments of the invention will now be described by way of example.

EMBODIMENT 1

Figure 1:
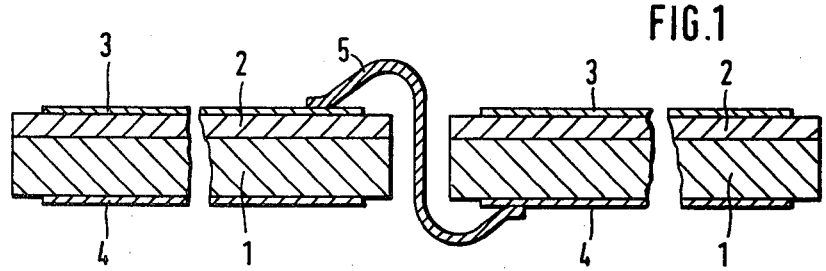
FIG. 1 is a schematic view showing two solar cells connected together in accordance with a first embodiment of the invention.

In FIG. 1, two solar cells each comprising a p-silicon 1 and an n+-silicon region 2 are provided with contacts 3 for the front face and contacts 4 for the rear face. The front face contact 3 of the left-hand solar cell is connected to the rear face contact 4 of the right-hand solar cell, so as to be electrically conductive, by means of a foil 5 comprising an amorphous metal alloy $Fe_{80}B_{20}$ (an alloy comprising 80% by weight iron and 20% by weight boron). As a result both solar cells are connected electrically in series.

EMBODIMENT 2

Figure 2:
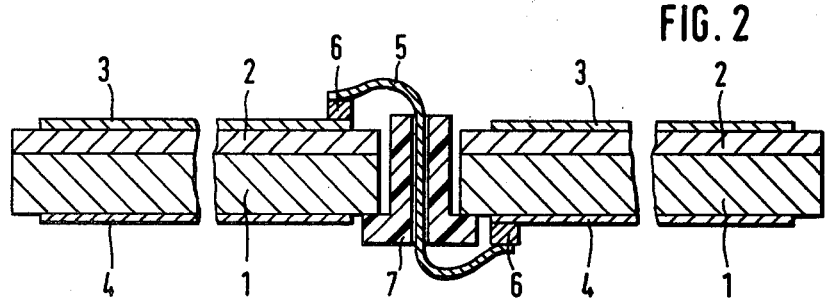
FIG. 2 is a schematic view showing a second embodiment.

In FIG. 2, metal elements 6 are rigidly soldered to the front face contact 3 of the n+-region 2 of the left-hand solar cell and to the rear face contact 4 of the p-region 1 of the right-hand solar cell. A wire 5 comprising amorphous metal, for example having the composition $Fe_{60}Cr_6Mo_6B_{28}$ (% by weight), which connects together the metal elements 6 on the top face of the left-hand solar cell and on the rear face of the right-hand solar cell and connects the solar cells electrically in series, is routed through an insulative support 7 located between the two adjacent solar cells.

EMBODIMENT 3

Figure 3:
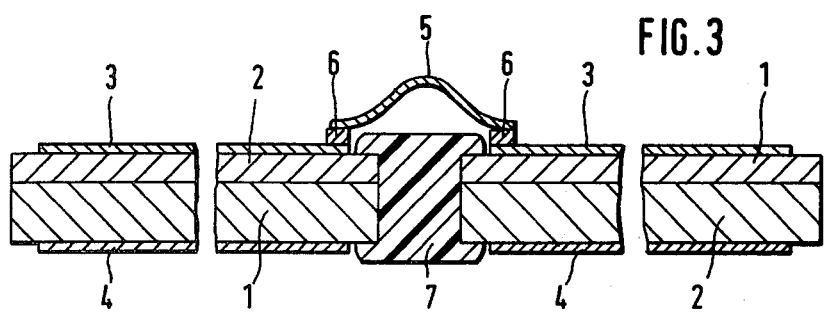
FIG. 3 is a schematic view showing a third embodiment.

In FIG. 3 p/n+-solar cell 1/2 is shown on the left and n/p+-solar cell 2/1 is shown on the right. The solar cells are mechanically connected together by means of the resilient insulative support 7 located between the said two solar cells. A strip of amorphous metal 5 for example having the composition $Fe_{80}P_{13}C_7$ (% by weight) connects the metal elements 6 on the front face contacts 3 of the two solar cells, which as a result are connected electrically in series. The respective rear face contacts of the solar cells are designated 4.

It will be understood that the above description of the present invention is susceptible to various modifications, changes, and adaptations.

What we claim is:

1. A solar cell array comprising solar cells which are connected together electrically, in which the electrical connections between the solar cells are strips or wires comprising amorphous metals.

2. A solar cell array as defined in claim 1, wherein said solar cells comprise silicon solar cells.

3. A solar cell array as defined in claim 1 wherein said electrical connections comprise alloys containing alloy components chosen from iron, copper, nickel, cobalt, chromium, molybdenum, aluminum, zinc, lead, tin or vanadium; or mixtures of the said alloy components with non-metallic materials chosen from boron, carbon, phosphorous, arsenic or silicon.

4. A solar cell array comprising a plurality of solar cells and electrical interconnector means comprising amorphous metal conductors between said solar cells.

* * * * *